(12) United States Patent
Zhou et al.

(10) Patent No.: US 10,066,876 B2
(45) Date of Patent: Sep. 4, 2018

(54) VAPOR CHAMBER HEAT FLUX RECTIFIER AND THERMAL SWITCH

(71) Applicants: Toyota Motor Engineering & Manufacturing North America, Inc., Erlanger, KY (US); The Board of Trustees of the Leland Stanford Junior University, Stanford, CA (US)

(72) Inventors: Feng Zhou, South Lyon, MI (US); Ercan M. Dede, Ann Arbor, MI (US); Mehdi Asheghi, Palo Alto, CA (US); James W. Palko, Redwood City, CA (US); Kenneth E. Goodson, Portola Valley, CA (US)

(73) Assignees: Toyota Motor Engineering & Manufacturing North America, Inc., Erlanger, KY (US); The Board of Trustees of the Leland Stanford Junior University, Stanford, CA (US)

( * ) Notice: Subject to any disclaimer, the term of this patent is extended or adjusted under 35 U.S.C. 154(b) by 68 days.

(21) Appl. No.: 15/261,063

(22) Filed: Sep. 9, 2016

(65) Prior Publication Data
US 2018/0073814 A1 Mar. 15, 2018

(51) Int. Cl.
*F28F 7/00* (2006.01)
*F28D 15/04* (2006.01)

(52) U.S. Cl.
CPC .................... *F28D 15/04* (2013.01)

(58) Field of Classification Search
CPC ...... F28D 15/04; F28D 15/043; F28D 15/046; F28D 2015/0216; F28D 2021/0028; F28D 2021/0029; H05K 7/20336; H05K 7/2029; H05K 7/208; H05K 7/20809; H05K 7/20818; H05K 7/20881; H05K 7/20936; F21V 29/006; F21V 29/40; F21V 29/402; F21V 29/51; H01F 27/18; H01L 23/427;
(Continued)

(56) References Cited

U.S. PATENT DOCUMENTS 3,399,717 A * 9/1968 Cline ..................... F28D 15/06
165/104.26
3,673,306 A * 6/1972 Kirkpatrick ......... F28D 15/0266
165/104.26
(Continued)

*Primary Examiner* — Justin Jonaitis
(74) *Attorney, Agent, or Firm* — Dinsmore & Shohl LLP

(57) ABSTRACT

Embodiments of an evaporator chamber heat flux rectifier and thermal switch are provided. Some embodiments include an evaporator layer with a first thermally conductive surface, a wicking structure for facilitating evaporation of a fluid in the vapor chamber heat flux rectifier, and a condenser layer that includes a second thermally conductive surface. Some embodiments include a middle layer, where when heat is applied to the first thermally conductive surface, the vapor chamber heat flux rectifier operates as a thermal conductor. Some embodiments that operate as a thermal switch include a non-condensable gas reservoir that is coupled to the condenser layer. The non-condensable gas reservoir may store a non-condensable gas when a threshold heat flux is applied to the evaporator layer. The non-condensable gas provides thermal insulation between the evaporator layer and the condenser layer when the threshold heat flux is not applied to the evaporator layer.

20 Claims, 8 Drawing Sheets

(58) Field of Classification Search
CPC ....... H01L 33/648; H01L 23/40; H01L 23/46;
H01L 23/473; H01L 23/4735
USPC ........................... 165/80.4, 104.26; 361/700
See application file for complete search history.

(56) References Cited

U.S. PATENT DOCUMENTS

| | | | |
|---|---|---|---|
| 3,957,107 A * | 5/1976 | Altoz | F28D 15/06 165/104.26 |
| 4,402,358 A * | 9/1983 | Wolf | F28D 15/04 165/104.26 |
| 4,951,740 A * | 8/1990 | Peterson | F28D 15/046 165/104.26 |
| 7,796,389 B2 | 9/2010 | Edmunds et al. | |
| 9,163,883 B2 | 10/2015 | Yang et al. | |
| 2006/0124281 A1* | 6/2006 | Rosenfeld | F28D 15/046 165/104.26 |
| 2006/0213648 A1* | 9/2006 | Chen | F28D 15/0233 165/104.33 |
| 2009/0025910 A1* | 1/2009 | Hoffman | F28D 15/046 165/104.26 |
| 2014/0083653 A1 | 3/2014 | Kempers et al. | |
| 2014/0090815 A1 | 4/2014 | Salamon et al. | |
| 2015/0200344 A1 | 7/2015 | Francis et al. | |

\* cited by examiner

US 10,066,876 B2

VAPOR CHAMBER HEAT FLUX RECTIFIER AND THERMAL SWITCH

TECHNICAL FIELD

Embodiment described herein generally relate to a vapor chamber heat flux rectifier and thermal switch and, more specifically, to embodiments of a vapor chamber that may operate to prevent flow of heat in a predetermined direction and/or provide variable resistance to the flow of heat.

BACKGROUND

Devices such as battery packs, engines, fuel cell stacks, catalyst converters, and the like often benefit from a rapid warm-up period at a cold start and effective cooling once the device has warmed up. While these devices may operate without thermal assistance, oftentimes, optimum efficiency is not realized either because the device is too cold or the device is too hot. Similarly, many devices may also utilize effective unidirectional heat dissipation, such as for cooling, warming, and/or other functions. While many current devices utilize a thermal switch or thermal diode, many of these current solutions have focused on actively tuning thermal conductivity in materials. These current solutions often require significant changes in structure and/or bonding character. As a result, these current solutions may provide low on/off resistance ratios and/or suffer from contact resistance and poor reliability. Thus, a need exists in the industry.

SUMMARY

Embodiments of an evaporator chamber heat flux rectifier are provided. Some embodiments include an evaporator layer that includes a first thermally conductive surface and an evaporator wicking structure for facilitating evaporation of a fluid in the vapor chamber heat flux rectifier and a condenser layer that includes a second thermally conductive surface and a condenser wicking structure for facilitating condensation of the fluid in the vapor chamber heat flux rectifier. Similarly, some embodiments include a middle layer that includes a coupling wicking structure that is coupled to the evaporator wicking structure, where when heat is applied to the first thermally conductive surface, the vapor chamber heat flux rectifier operates as a thermal conductor. In some embodiments, when heat is applied to the second thermally conductive surface, the vapor chamber heat flux rectifier operates as a thermal insulator.

In another embodiment, an evaporator chamber heat flux rectifier includes an evaporator layer that includes a first thermally conductive surface and an evaporator wicking structure for facilitating evaporation of a fluid in the vapor chamber heat flux rectifier and a condenser layer that includes a second thermally conductive surface and a condenser wicking structure for facilitating condensation of the fluid in the vapor chamber heat flux rectifier. Some embodiments include a middle layer that includes a coupling wicking structure that is coupled to the evaporator wicking structure, where when heat is applied to the first thermally conductive surface. Similarly, some embodiments include a non-condensable gas in the vapor chamber heat flux rectifier, where in response to receiving a threshold heat flux, a saturation pressure of the fluid exceeds an ambient pressure of the vapor chamber heat flux rectifier, the fluid facilitates transferring of heat out of the vapor chamber heat flux rectifier. In some embodiments, if an amount of heat that is lower than the threshold heat flux is applied to the vapor chamber heat flux rectifier, the vapor chamber heat flux rectifier operates as a thermal insulator.

In yet another embodiment, a vapor chamber heat flux rectifier includes an evaporator layer that includes a first thermally conductive surface and an evaporator wicking structure for facilitating evaporation of a fluid in the vapor chamber heat flux rectifier and a condenser layer that includes a second thermally conductive surface and a condenser wicking structure for facilitating condensation of the fluid in the vapor chamber heat flux rectifier. Some embodiments include a middle layer that includes a coupling wicking structure that is coupled to the evaporator wicking structure but not to the condenser wicking structure until a threshold heat flux is applied to the evaporator layer. When the threshold heat flux is applied to the first thermally conductive surface, the coupling wicking structure couples with the condenser wicking structure to provide a condensation path for the fluid, thereby operating a thermal conductor. In some embodiments, when heat is applied to the vapor chamber heat flux rectifier that is lower than the threshold heat flux, the vapor chamber heat flux rectifier operates as a thermal insulator.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Embodiments disclosed herein include a vapor chamber heat flux rectifier (referred to herein as a vapor chamber) that operates as a thermal diode and a thermal switch. Accordingly, some embodiments may include different types of heat flux rectifiers based on vapor chamber technology. These devices can switch between a thermal conductor and a thermal insulator to allow heat flow in a predetermined direction when the temperature reaches a pre-set point based on pressure inside the chamber. Some embodiments may utilize deformable pillar connections between evaporator and condenser sides of the chamber based on a pillar coefficient of thermal expansion plus structural compliance. Embodiments may also extend to a device capable of switching between high and low thermal resistance states, based on operating temperature.

As a thermal switch, the vapor chamber may receive a threshold heat flux. In response to receiving the threshold heat flux (e.g., if the heat is enough to trigger the switch), the vapor chamber may operate as a thermal conductor and thus release at least a portion of the heat out of the vapor chamber. If the received heat is an amount of heat that is less than the threshold heat flux, the vapor chamber may operate as a thermal insulator and retain at least a portion of the heat. These and other embodiments incorporating the same will be described in more detail, below.

Figure 1:
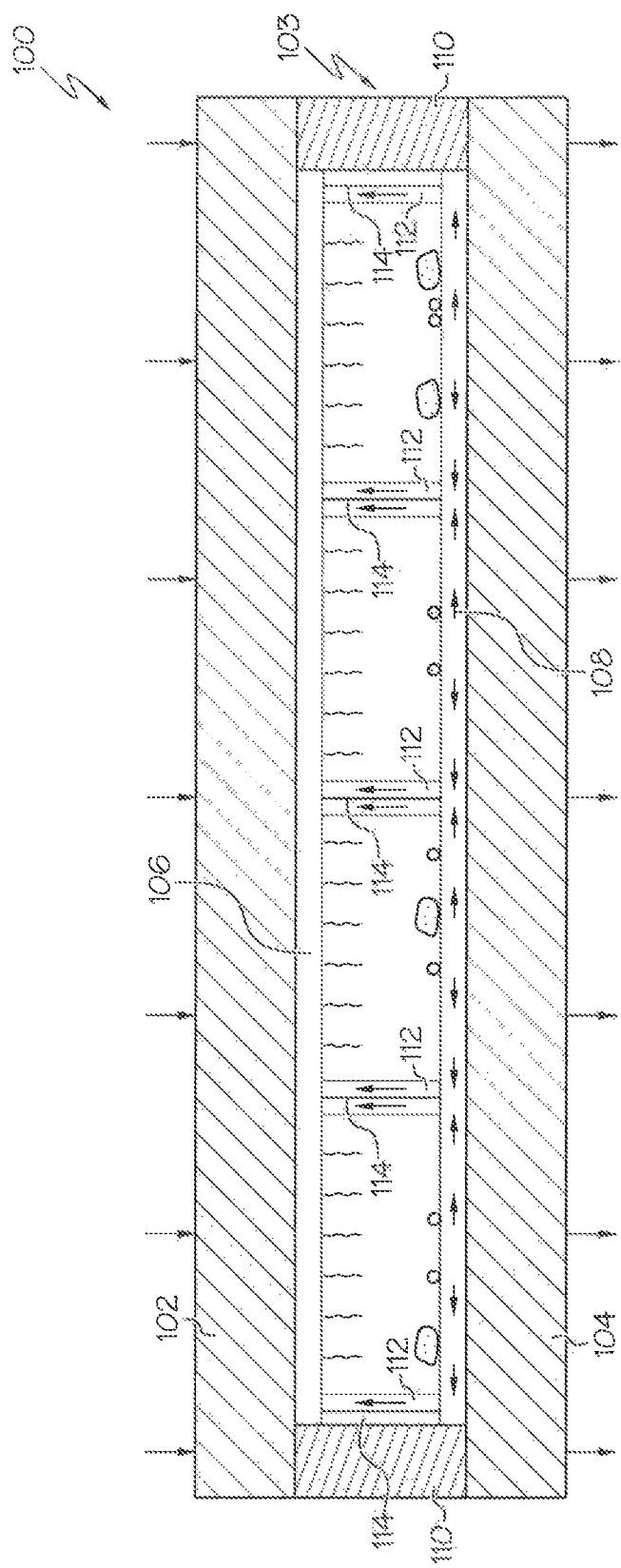
FIG. 1 depicts a vapor chamber for operating as a thermal diode, according to embodiments described herein.

Referring now to the drawings, FIG. 1 depicts a vapor chamber 100 for operating as a thermal diode, according to embodiments described herein. The vapor chamber 100 may have a plane profile, the cross-section of which is depicted in FIG. 1 and may take any of a plurality of different shapes, such as rectangular, circular, triangular, elliptical, etc. for storing a fluid. The vapor chamber 100 may include an evaporator layer 102 (top layer), a middle layer 103, and a condenser layer 104 (bottom layer). Both the evaporator layer 102 and the condenser layer 104 may be constructed of a material with a high thermal conductivity. Thus, the evaporator layer 102 may include a first thermally conductive surface and the condenser layer 104 may have a second thermally conductive surface. As an example, copper, aluminum, silicon, iron, lead, etc. may be used for these thermal conductors. The condenser layer 104 may additionally include and/or be coupled to a heat sink.

The middle layer 103 may be constructed of a material with a low thermal conductivity to cut off the path of heat flux. The evaporator layer 102 and condenser layer 104 may each may have a wicking structure 106, 108 (which may be constructed of porous media) attached thereto. The difference is the evaporator wicking structure 106 may be constructed of a thick fine wick and may have a higher capillary force (e.g. high porosity and smaller pores). The evaporator wicking structure 106 may also be relatively thicker than the condenser wicking structure 108 so that most of the liquid would be stored in the evaporator wicking structure 106. The condenser wicking structure 108 may have a lower capillary force and may be thinner. As a result, less fluid could stay in the condenser wicking structure 108.

The lateral sides of the vapor chamber 100 (e.g., sealing material 110) may be constructed of a material with a low thermal conductivity to provide thermal insulation. This material may include glass, quartz, ceramic, and/or other thermal insulator and may have any desired thickness (depending on the material being utilized and the thickness requirement of the application). A plurality of coupling wicking structures 112 may be constructed of porous media with high porosity (where the pore size is larger compared to the evaporator wick to draw liquid into the evaporator) and low thermal conductivity. The coupling wicking structures 112 may be constructed of porous ceramic and/or other similar material. The coupling wicking structure may configured as an array of pillars and/or other desired configuration.

Depending on the embodiment, the coupling wicking structures 112 may cover respective solid pillars 114, which may both be disposed between the evaporator layer 102 and the condenser layer 104. The solid pillars 114 may be utilized for mechanical support of the vapor chamber 100, since the pressure within the vapor chamber 100 could be lower than the outside environment. The coupling wicking structures 112 may provide a path for the condensate to return from the condenser layer 104 to the evaporator layer 102. The solid pillars 114 and coupling wicking structures 112 may be constructed of low thermal conductivity material.

Similarly, the coupling wicking structures 112, the evaporator wicking structure 106, and the condenser wicking structure 108 may be configured such that the evaporator wicking structure 106 the highest capillary force of the three. The coupling wicking structures 112 may have the next highest capillary force, with the condenser wicking structure 108 having the lowest capillary force. The gradient of the capillary force ensures that the fluid tends to be stored in the evaporator, even when there no evaporation and condensation is occurring.

When the evaporator layer 102 is heated and the condenser layer 104 is cooled or otherwise not heated (referred to herein as "forward mode"), the fluid within the evaporator wicking structure 106 starts evaporating. The vapor carries heat away from the top surface of the evaporator layer 102 and condenses on the condenser wicking structure 108. The condensate returns back to the evaporator wicking structure 106 via the coupling wicking structures 112, due to capillary force. This completes circulation of the fluid with highly effective phase-change heat transfer.

When the bottom surface of the condenser layer 104 is heated and top surface of the evaporator side is cooled or otherwise not heated (referred to herein as "reverse mode"), the condenser wicking structure 108 dries out, since most of the liquid is stored in the evaporator wicking structure 106. Therefore, a thermal rectification in forward and reserve operation modes can be expected, thus providing a thermal diode.

Additionally, the evaporating temperature of the liquid can be tuned by controlling the pressure inside the vapor chamber 100 during the packaging process. Further, different fluids can be used for different applications, e.g. water, refrigerant, etc. By controlling the pressure inside the vapor chamber 100, a temperature may be set up as the fluid boiling point of the liquid. When the temperature at the evaporator layer 102 is lower than this setting point, the heat is transferred only through conduction of the layers 102, 103, 104. Due to low thermal conductivity of the middle layer 103, the vapor chamber 100, as a whole, functions as an insulator.

Figure 2:
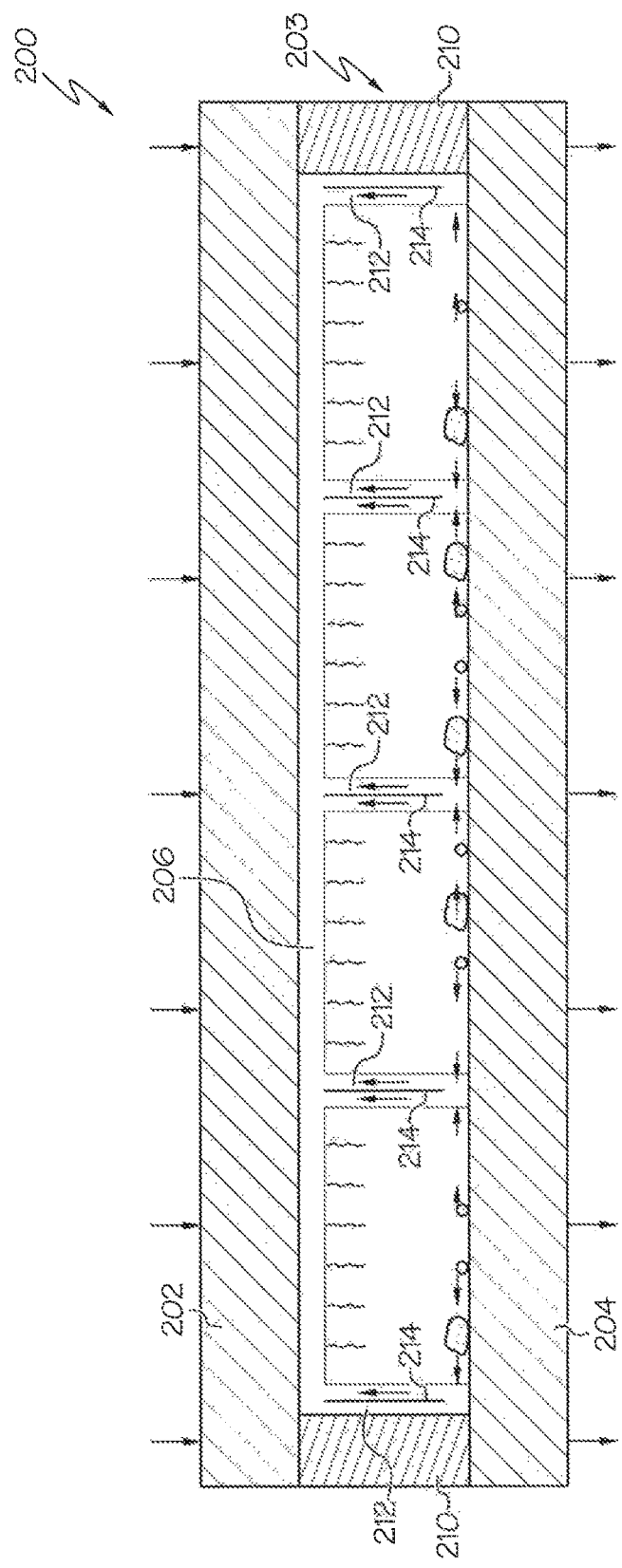
FIG. 2 depicts a heat flux rectifier that does not utilize a thin coarse wick, according to embodiments described herein.

FIG. 2 depicts a vapor chamber 200 that does not utilize a thin coarse wick, according to embodiments described herein. Similar to the embodiment depicted in FIG. 1, the vapor chamber 200 may include an evaporator layer 202, a middle layer 203, and a condenser layer 204. The evaporator layer 202 may include an evaporator wicking structure 206. The evaporator wicking structure 206 may be configured with a thick fine wick that has a high porosity and a high thermal conductivity. Similarly, coupling wicking structures 212 may surround solid pillars 214. To achieve the high porosity, the evaporator wicking structure 206 may be configured as a copper inverse opal and/or may be treated with copper particles. The solid pillars 214 may have a low thermal conductivity, as described with the embodiment of FIG. 1 and thus may be constructed of ceramic, nickel, quartz, and/or other material. Also included is a sealing material 210, which may also have a low thermal conductivity, such as quartz, ceramic, and/or other material.

While the structures depicted in FIGS. 1 and 2 are similar, instead of the thin coarse wick described with regard FIG. 1, radial grooves may be carved on the condenser layer 204, orienting towards the solid pillars 214. These radial grooves function as capillary tubes to guide the condensate towards the solid pillars 214 that then returns the fluid to the evaporator layer 202.

Figure 3:
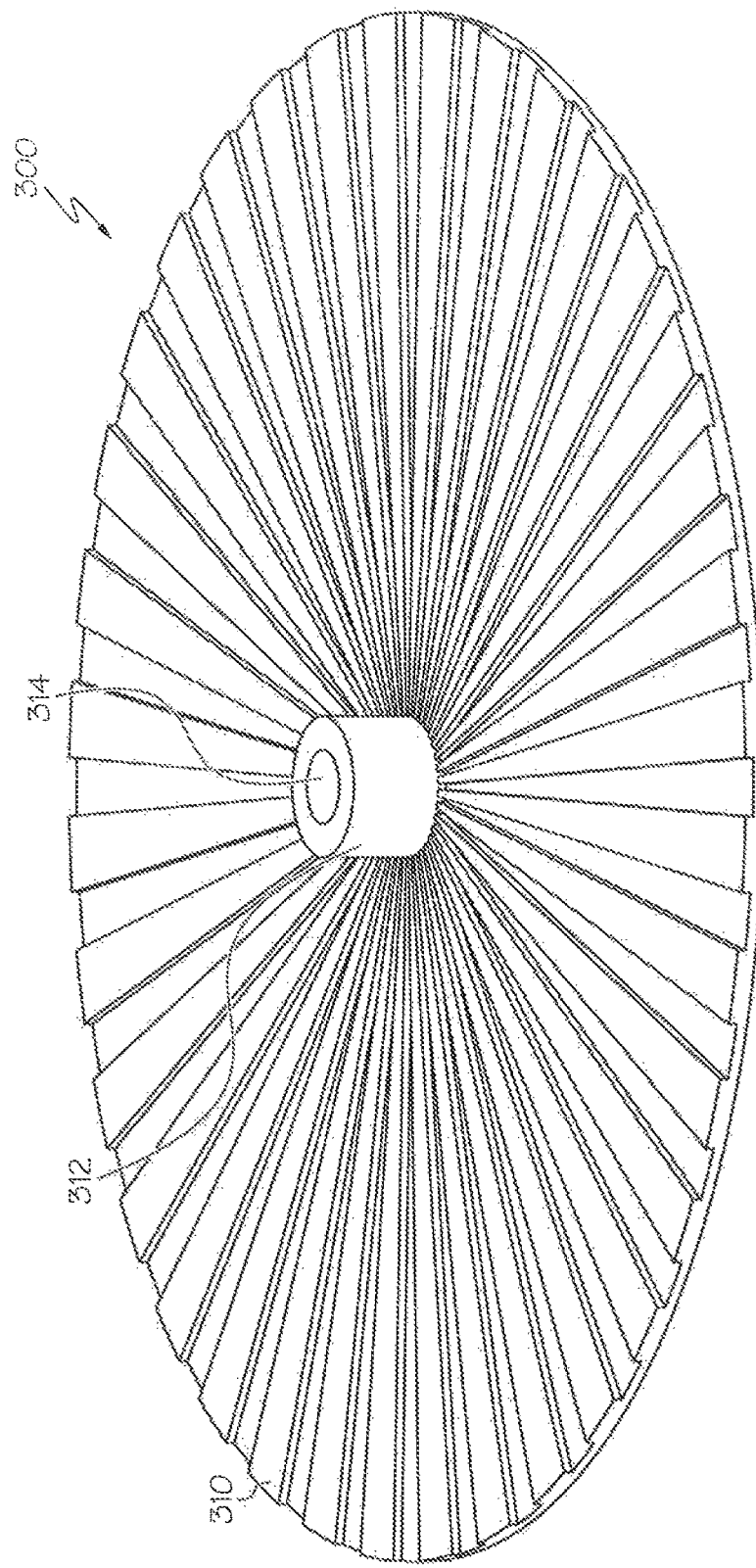
FIG. 3 depicts a grooved coarse wicking structure, according to embodiments described herein.

FIG. 3 depicts a grooved coarse wicking structure 300, according to embodiments described herein. As illustrated, the grooved coarse wicking structure 300 may include radial grooves 310, a coarse wicking structure 312, and a solid pillar 314. The radial grooves 310 may receive condensate and direct the condensate to the coarse wicking structure 312. The coarse wicking structure 312 may be configured with a high porosity and low thermal conductivity, as described above with regard to the coupling wicking structures 112 described above in FIG. 1. The solid pillar 314 may have a low thermal conductivity, as also described above with regard to the solid pillar 114 (FIG. 1).

Referring again to FIG. 2, the radial grooves 310 may be part of the condenser layer 204 to guide the condensate to the solid pillars 214 and the coupling wicking structure 212. As such, the embodiment of FIG. 2 does not utilize a condenser wicking structure, because the radial grooves 310 perform a similar function.

It should be understood that while the grooved coarse wicking structure 300 is depicted as a circular or oval shape, this is merely an example. Other shapes may be utilized depending on the embodiment.

Figure 4A:
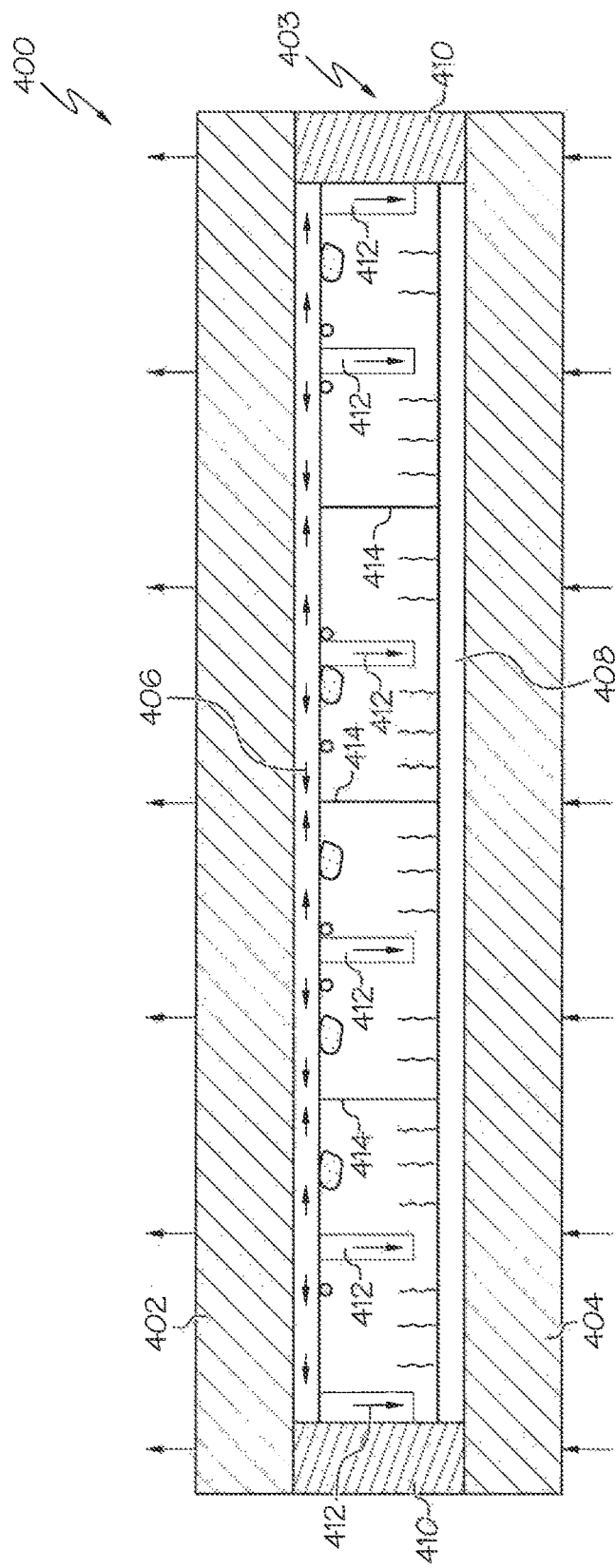
FIGS. 4A and 4B depict a vapor chamber with a movable wicking structure attached to a evaporator layer, according to embodiments described herein.

FIG. 4A depicts a vapor chamber 400 with a movable wicking structure 412 attached to a evaporator layer 402, but disconnected from an condenser layer 404 of the vapor chamber 400, according to embodiments described herein. As illustrated, the vapor chamber 400 includes an evaporator layer 402, a middle layer 403, and a condenser layer 404. The evaporator layer 402 includes all evaporator wicking structure 406, while the condenser layer 404 includes a condenser wicking structure 408. Coupled to the evaporator wicking structure 406 is a coupling wicking structure that operates as a movable wicking structure 412 that is not coupled to the condenser wicking structure 408 in a first state, such as in the absence of a threshold heat flux. Also included are solid pillars 414. Thus when no heat is applied or heat is applied to the condenser layer 404, the movable wicking structures do not connect with the condenser wicking structure, cutting off the condensate return path.

Figure 4B:
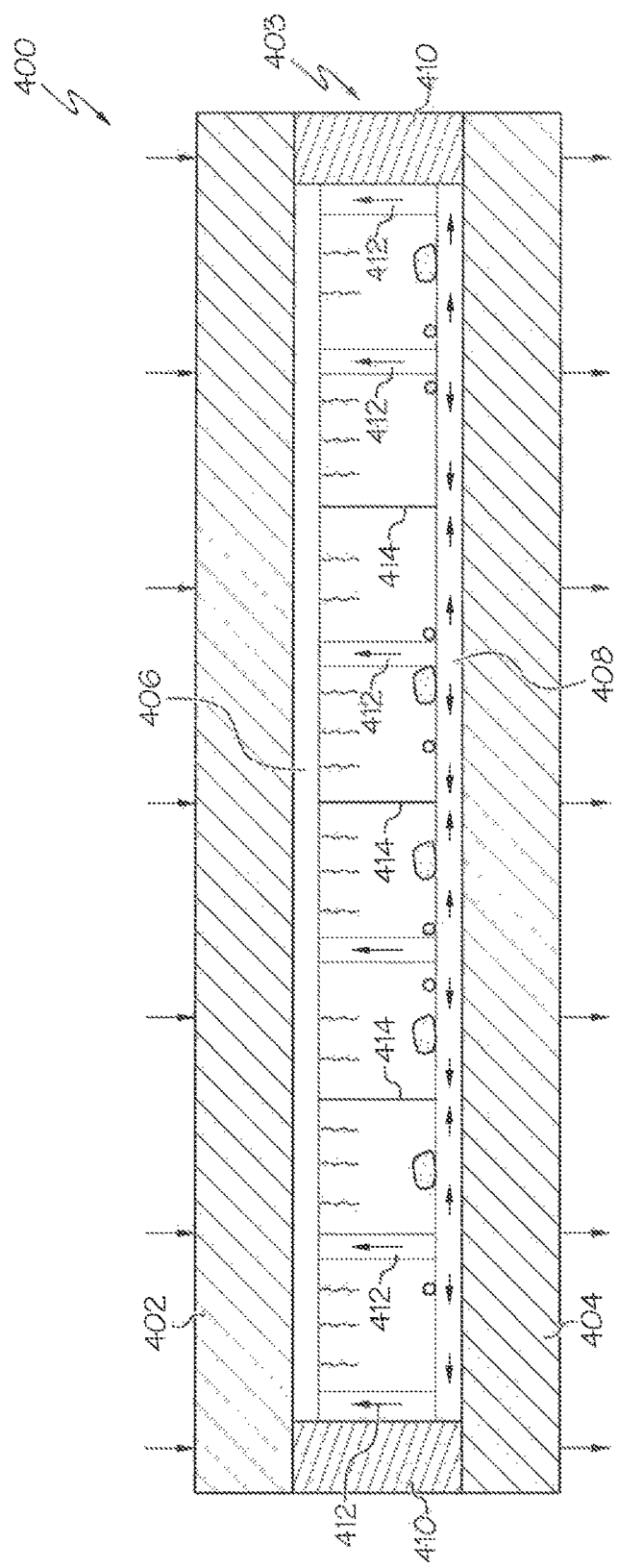

FIG. 4B depicts the vapor chamber 400 with the movable wicking structure 412 coupling with the condenser wicking structure 408 in response to a threshold heat flux being applied to the evaporator layer 402. Specifically, the movable wicking structure 412 may be constructed of a porous media that has a temperature dependent coefficient of thermal expansion. When the top surface of the evaporator layer 402 is not heated to a predetermined temperature (or the condenser layer 404 is heated), the movable wicking structure 412 pillar will remain disconnected from the condenser wicking structure 408, cutting off the condensate return path to the evaporator layer 402. Thus, this causes the vapor chamber 400 to act as a thermal insulator.

When the evaporator layer 402 is heated to the predetermined temperature (or temperature range), the movable wicking structure 412 will expand to connect with the condenser wicking structure 408, thereby creating a condensation path to dissipate heat. As a consequence, the embodiment of FIGS. 4A and 4B are configured as a unidirectional thermal switch and/or a thermal diode.

Figure 5A:
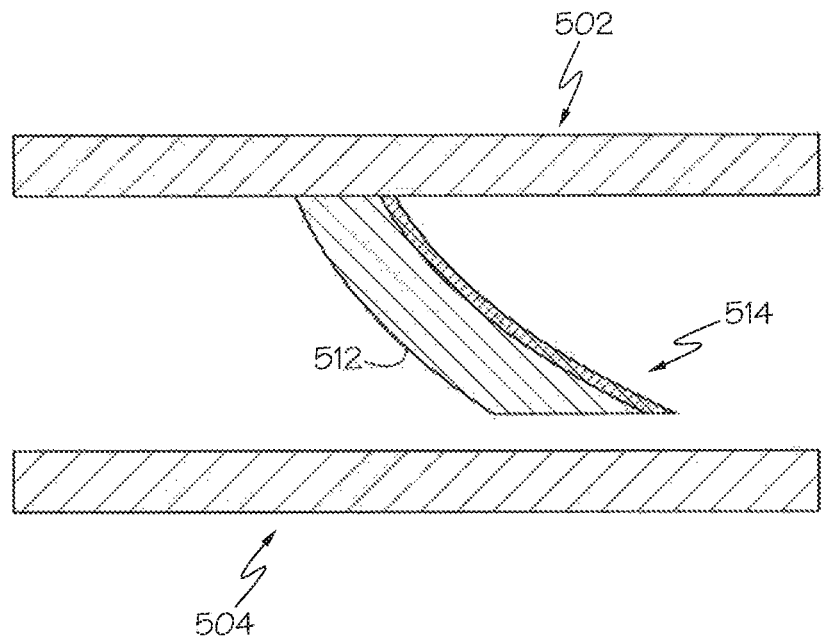
FIGS. 5A and 5B depict a flexible structure that may expand to connect to a bottom layer when heat is applied, according to embodiments described herein.
Figure 5B:
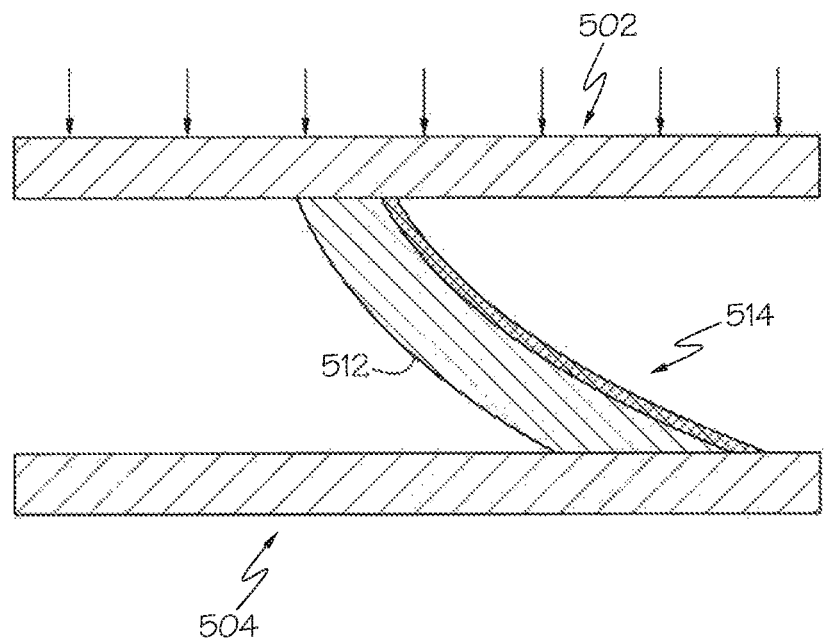

FIGS. 5A and 5B depict a flexible wicking structure 512 that may expand to connect from an evaporator layer 502 to a condenser layer 504 when heat is applied, according to embodiments described herein. As illustrated, the coupling wicking structure may be configured as a flexible wicking structure 512. The flexible wicking structure 512 may have a small coefficient of thermal expansion, but may be quite flexible. The flexible wicking structure 512 may be attached to a supporting piece 514, such as a metal or other material with a large coefficient of thermal expansion relative to the flexible wicking structure 512, which is connected to the evaporator layer 502.

When the evaporator layer 502 is heated, the supporting piece 514 is heated and thus expands, pushing the flexible wicking structure 512 towards the condenser layer 504, building up the condensation path. Similar to the embodiment of FIG. 4, the embodiment of FIGS. 5A and 5B may be configured to operate as a unidirectional thermal switch such that heat is retained until reaching a predetermined temperature, at which point heat may be dissipated. Similarly, because heat may only travel in one direction, the embodiments of FIG. 5A and FIG. 5B may operate as a thermal diode.

Figure 6:
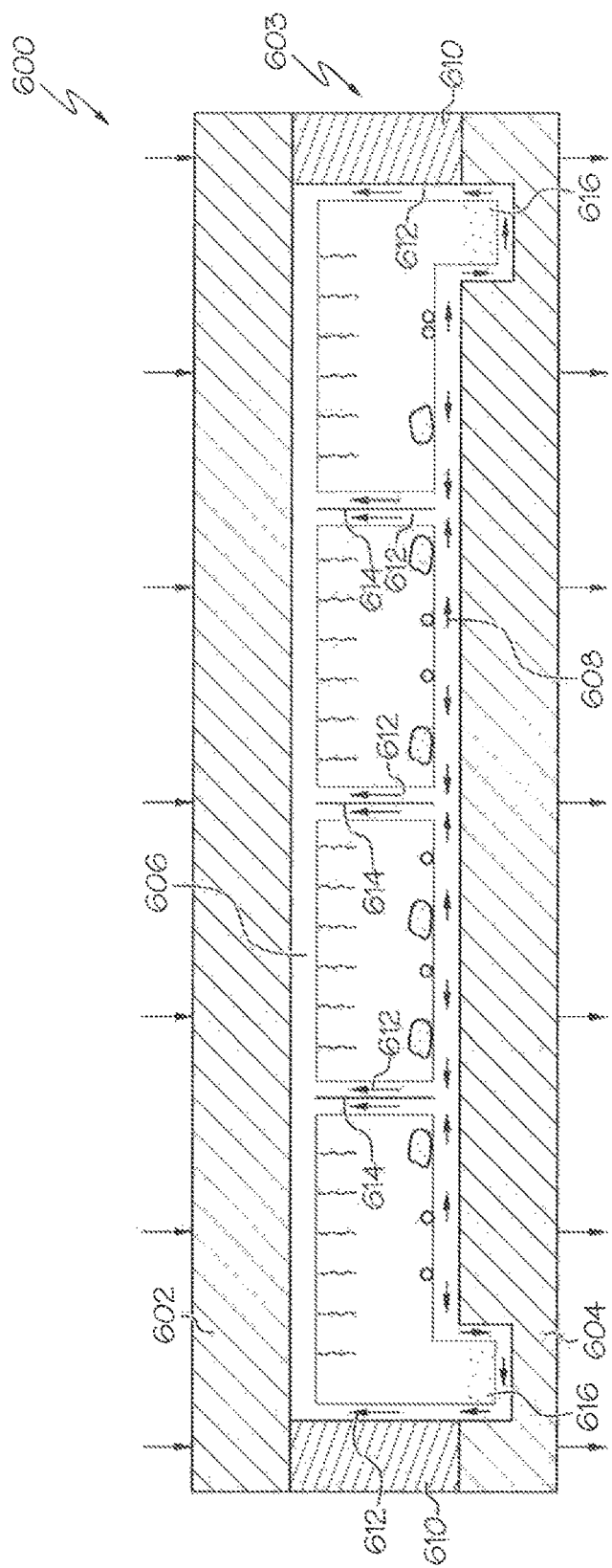
FIG. 6 depicts a vapor chamber that utilizes a non-condensable gas reservoir for providing thermal switching functionality, according to embodiments described herein.

FIG. 6 depicts a vapor chamber 600 that utilizes a non-condensable gas reservoir 616 for providing thermal switching functionality, according to embodiments described herein. Specifically, the vapor chamber 600 includes an evaporator layer 602, a middle layer 603, and a condenser layer 604. The evaporator layer 602 may include an evaporator wicking structure 606, which may be configured as a thick fine porous media with high porosity and high thermal conductivity. The evaporator layer 602 may include a condenser wicking structure 608, which may include a thick course porous material with high porosity and high thermal conductivity.

Additionally included are coupling wicking structures 612, which are coupled to solid pillars 614. The coupling wicking structures 612 may be configured as a coarse porous material with high porosity and low thermal conductivity. A vapor chamber sealing material 610 may also be included and may have lower thermal conductivity.

Also included are one or more non-condensable gas reservoirs 616. The non-condensable gas reservoirs 616 may be configured to receive a non-condensable gas, such as nitrogen, light hydrocarbons, carbon dioxide, and/or other non-condensable gaseous materials. Specifically, to control the boiling point within the vapor chamber 600, the vapor chamber 600 may be at least partially vacuumed. The non-condensable gas reservoir 616 may be disposed on the condenser layer 604. As the evaporation occurs, the vapor will drive the non-condensable gas into the non-condensable gas reservoir 616, so that the heat transfer between evaporator wicking structure 606 and the condenser wicking structure 608 between the non-condensable gas reservoirs 616 can be more efficient. When the bottom surface of the condenser layer 604 is heated, the non-condensable gas may diffuse to cover the surface of the evaporator wicking structure 606, making the vapor chamber 600 a better insulator. By adding the non-condensable gas reservoirs 616, the diodicity of the vapor chamber 600 increases.

Accordingly, non-condensable gas in the vapor chamber 600 also allows thermal switching functionality. For use as a temperature activated thermal switch, the vapor chamber 600 is filled with non-condensable gas to a predetermined pressure. The abrupt and dramatic change in thermal resistance is based on a transition in the phase change mechanism for the working fluid at the evaporator layer 602 of the vapor chamber 600. For temperatures where the saturation pressure of the working fluid is below the ambient pressure of the chamber due to the presence of non-condensable gas, heat transfer is primarily due to evaporation from the top surface of the evaporator wicking structure 606 and conduction through the solid pillars 614 via the coupling wicking structures 612 that joins the condenser layer 604 and the evaporator layer 602. As temperature rises, and the saturation pressure of working fluid exceeds the ambient chamber pressure, and boiling occurs, with bubbles of vapor produced in the evaporator wicking structure 606 that then escapes to the atmosphere. The non-condensable gas may then travel to the non-condensable gas reservoir 616 when a threshold heat flux is applied to the vapor chamber 600.

Figure 7A:
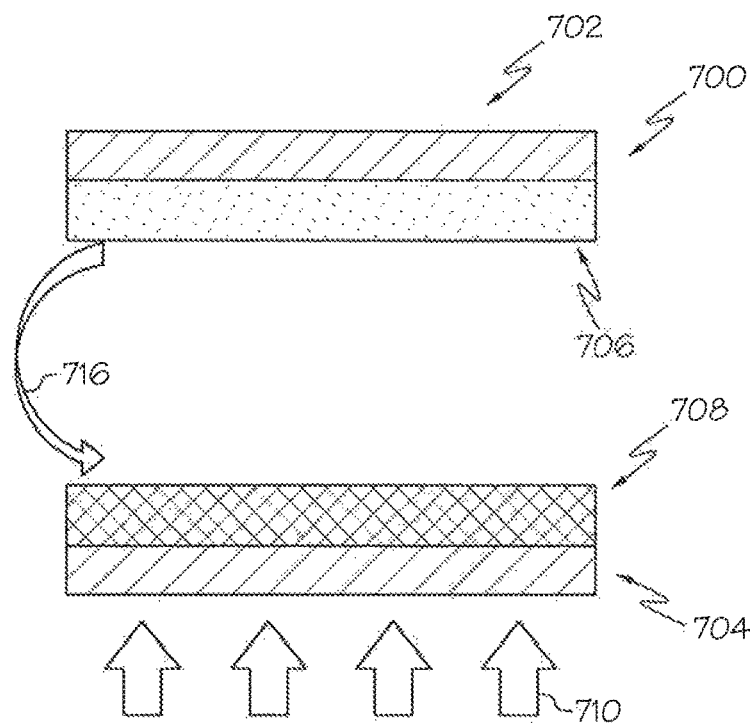
FIGS. 7A and 7B depict a vapor chamber that operates as a thermal switch, according to embodiments described herein.
Figure 7B:
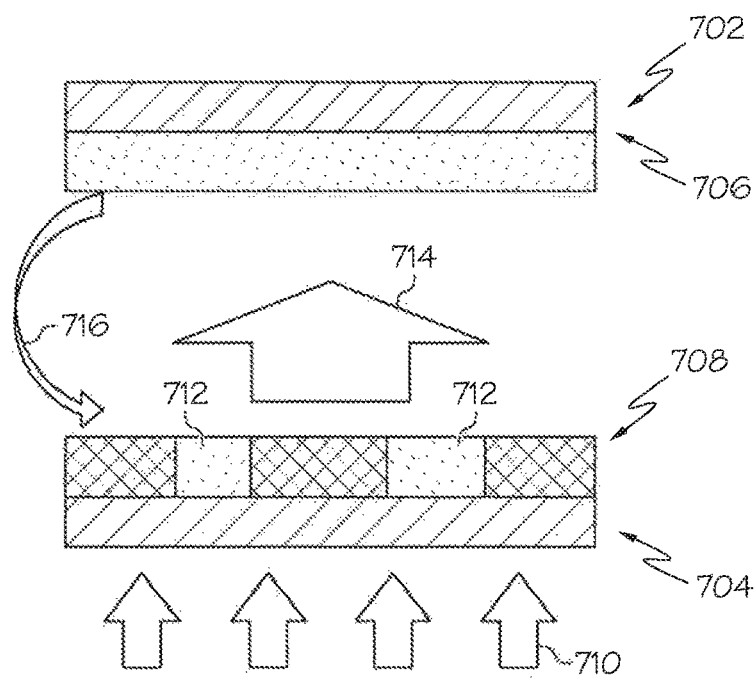

FIGS. 7A, 7B depict a vapor chamber 700 that operates as a thermal switch, according to embodiments described herein. As illustrated, the vapor chamber 700 may include a condenser layer 702, an evaporator layer 704, and a non-condensing atmosphere utilized to form a high contrast thermal switch. In FIG. 7A, when heat 710 is applied such that the temperature of the evaporator is well below the switching temperature (T switch), evaporation at the surface of the evaporator wicking structure 708 (which may be saturated with fluid) produces a small additional concentration of vapor above the evaporator wicking structure 708. The partial pressure of vapor may substantially equal the saturation pressure of the working fluid corresponding to the wick temperature and be small compared to the non-condensable partial pressure, $P\_NC$. Therefore, $Psat(T\_wick) \ll P\_NC$ and $P\_cond \cong P\_wick \cong P\_NC$. The non-condensing component adjusts to maintain an essentially uniform pressure in the vapor chamber 700, and the vapor will diffuse through the non-condensable gas atmosphere to the condenser layer 702 and/or condenser wicking structure 706, resulting in a high thermal resistance.

As the temperature of the evaporator wicking structure 708 increases by application of heat 710 (FIG. 7B) and the corresponding saturation pressure of the working fluid exceeds the pressure of the overlying non-condensable gas atmosphere, vapor bubbles 712 may be generated in the evaporator wicking structure 708 as boiling is initiated. The pressure in the vapor chamber 700 is then non-uniform with the excess pressure above the evaporator wicking structure 706 driving bulk flow of vapor and heat transfer 714 toward the condenser layer 702, vastly enhancing mass transport and reducing thermal resistance. Liquid return 716 may also be facilitated as described above. The pressure of the non-condensing component controls the switching temperature.

As illustrated above, various embodiments a vapor chamber heat flux rectifier that can operate as a thermal diode and/or a thermal switch are disclosed. Specifically, embodiments described herein provide different types of heat flux rectifiers based on vapor chamber technology. These embodiments can operate as a switch between a thermal conduction and a thermal insulator. Embodiments may also allow heat to flow in a predetermined direction when the temperature reaches a predetermined point based on pressure inside the vapor chamber. Embodiments described herein may also utilize deformable pillar connections between an evaporator layer and a condenser layer based on the coefficient of thermal expansion of the pillars.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein includes systems, methods, and non-transitory computer-readable mediums for a vapor chamber heat flux rectifier. It should also be understood that these embodiments are merely exemplary and are not intended to limit the scope of this disclosure.

What is claimed is:

1. A vapor chamber heat flux rectifier comprising:
   an evaporator layer that includes a first thermally conductive surface and an evaporator wicking structure for facilitating evaporation of a fluid in the vapor chamber heat flux rectifier;
   a condenser layer that includes a second thermally conductive surface and a condenser wicking structure for facilitating condensation of the fluid in the vapor chamber heat flux rectifier; and
   a middle layer that includes a coupling wicking structure that is coupled to the evaporator wicking structure, wherein when heat is applied to the first thermally conductive surface, the vapor chamber heat flux rectifier operates as a thermal conductor, wherein when heat is applied to the second thermally conductive surface, the middle layer thermally decouples the evaporator layer and the condenser layer, thereby causing the vapor chamber heat flux rectifier to operate as a thermal insulator.

2. The vapor chamber heat flux rectifier of claim 1, further comprising a solid pillar for connecting the evaporator layer with the condenser layer.

3. The vapor chamber heat flux rectifier of claim 1, wherein the condenser wicking structure comprises at least one of the following: a grooved coarse wicking structure and a coarse wick with high porosity and high thermal conductivity.

4. The vapor chamber heat flux rectifier of claim 1, further comprising a sealing material, wherein the sealing material includes a low thermal conductivity.

5. The vapor chamber heat flux rectifier of claim 1, wherein the coupling wicking structure is not coupled to the condenser layer in a first state, and wherein in response to a threshold heat flux being applied to the evaporator layer, the coupling wicking structure expands to couple with the condenser layer, thereby creating a condensation path for the fluid to reach to the evaporator layer.

6. The vapor chamber heat flux rectifier of claim 1, wherein the coupling wicking structure comprises a flexible piece and a supporting piece with a large coefficient of thermal expansion relative to the flexible piece, wherein the coupling wicking structure is not coupled to the condenser layer in a first state, and wherein in response to a threshold heat flux being applied to the evaporator layer, the supporting piece expands, causing the coupling wicking structure to couple with the condenser wicking structure, thereby creating a condensation path for the fluid to reach the evaporator layer.

7. The vapor chamber heat flux rectifier of claim 1, further comprising a non-condensable gas reservoir that is coupled to the condenser layer to operate as a thermal switch, wherein the non-condensable gas reservoir stores a non-condensable gas when a threshold heat flux is applied to the evaporator layer and wherein the non-condensable gas provides thermal insulation between the evaporator layer and the condenser layer when the threshold heat flux is not applied to the evaporator layer.

8. The vapor chamber heat flux rectifier of claim 1, further comprising a non-condensable gas and operating as a thermal switch, wherein in response to receiving a threshold heat flux, saturation pressure of the fluid exceeds the ambient pressure within the vapor chamber heat flux rectifier and liquid within the vapor chamber heat flux rectifier boils, thereby transferring heat from the evaporator layer to the condenser layer and then out of the vapor chamber heat flux rectifier.

9. A vapor chamber heat flux rectifier comprising:
an evaporator layer that includes a first thermally conductive surface and an evaporator wicking structure for facilitating evaporation of a fluid in the vapor chamber heat flux rectifier;
a condenser layer that includes a second thermally conductive surface and a condenser wicking structure for facilitating condensation of the fluid in the vapor chamber heat flux rectifier;
a middle layer that includes a coupling wicking structure that is coupled to the evaporator wicking structure; and
non-condensable gas in the vapor chamber heat flux rectifier, wherein in response to receiving a threshold heat flux, a saturation pressure of the fluid exceeds an ambient pressure within the vapor chamber heat flux rectifier and fluid boiling facilitates transferring of heat from the evaporator layer to the condenser layer and out of the vapor chamber heat flux rectifier, thus operating as a thermal conductor, and wherein if an amount of heat that is lower than the threshold heat flux is applied to the vapor chamber heat flux rectifier, the vapor chamber heat flux rectifier operates as a thermal insulator.

10. The vapor chamber heat flux rectifier of claim 9, further comprising a solid pillar for connecting the evaporator layer with the condenser layer.

11. The vapor chamber heat flux rectifier of claim 10, wherein the condenser wicking structure comprises at least one of the following: a grooved coarse wicking structure and a thin coarse wick with high porosity and high thermal conductivity.

12. The vapor chamber heat flux rectifier of claim 9, further comprising a sealing material, wherein the sealing material includes a low thermal conductivity.

13. The vapor chamber heat flux rectifier of claim 9, wherein the coupling wicking structure is not coupled to the condenser layer in a first state, and wherein in response to the threshold heat flux being applied to the evaporator layer, the coupling wicking structure expands to couple with the condenser layer, thereby creating a condensation path for the fluid to reach to the evaporator layer.

14. The vapor chamber heat flux rectifier of claim 9, wherein the coupling wicking structure comprises a flexible piece and a supporting piece with a large coefficient of thermal expansion relative to the flexible piece, wherein the coupling wicking structure is not coupled to the condenser layer in a first state, and wherein in response to the threshold heat flux being applied to the evaporator layer, the supporting piece expands, causing the coupling wicking structure to couple with the condenser wicking structure, thereby creating a condensation path for the fluid to reach the evaporator layer.

15. The vapor chamber heat flux rectifier of claim 9, further comprising a non-condensable gas reservoir that is coupled to the condenser layer to operate as a thermal switch, wherein the non-condensable gas reservoir stores the non-condensable gas when the threshold heat flux is applied to the evaporator layer and wherein the non-condensable gas provides thermal insulation between the evaporator layer and the condenser layer when the amount of heat is lower than the threshold heat flux.

16. A vapor chamber heat flux rectifier comprising:
an evaporator layer that includes a first thermally conductive surface and an evaporator wicking structure for facilitating evaporation of a fluid in the vapor chamber heat flux rectifier;
a condenser layer that includes a second thermally conductive surface and a condenser wicking structure for facilitating condensation of the fluid in the vapor chamber heat flux rectifier; and
a middle layer that includes a coupling wicking structure that is coupled to the evaporator wicking structure but not to the condenser wicking structure until a threshold heat flux is applied to the evaporator layer, wherein when the threshold heat flux is applied to the first thermally conductive surface, the coupling wicking structure couples with the condenser wicking structure to provide a condensation path for the fluid, thereby operating a thermal conductor, wherein when heat is applied to the vapor chamber heat flux rectifier that is lower than the threshold heat flux, the vapor chamber heat flux rectifier operates as a thermal insulator.

17. The vapor chamber heat flux rectifier of claim 16, wherein the coupling wicking structure comprises a flexible piece and a supporting piece with a large coefficient of thermal expansion relative to the flexible piece, wherein the coupling wicking structure is not coupled to the condenser layer in a first state, and wherein in response to the threshold heat flux being applied to the evaporator layer, the supporting piece expands, causing the coupling wicking structure to couple with the condenser wicking structure, thereby creating the condensation path for the fluid to reach the evaporator layer.

18. The vapor chamber heat flux rectifier of claim 17, wherein the coupling wicking structure is constructed of a material with a coefficient of thermal expansion such that when the threshold heat flux is received, the coupling wicking structure expands to couple with the condenser wicking structure to provide the condensation path.

19. The vapor chamber heat flux rectifier of claim 16, further comprising a non-condensable gas reservoir that is coupled to the condenser layer to operate as a thermal switch, wherein the non-condensable gas reservoir stores a non-condensable gas when the threshold heat flux is applied to the evaporator layer and wherein the non-condensable gas provides thermal insulation between the evaporator layer and the condenser layer when the threshold heat flux is not applied to the evaporator layer.

20. The vapor chamber heat flux rectifier of claim 16, wherein when heat is applied to the condenser layer, the vapor chamber heat flux rectifier operates as the thermal insulator.

* * * * *